United States Patent
Norrgard et al.

(10) Patent No.: US 7,127,652 B2
(45) Date of Patent: Oct. 24, 2006

(54) X-TREE TEST METHOD AND APPARATUS IN A MULTIPLEXED DIGITAL SYSTEM

(75) Inventors: Dayton Norrgard, Fort Collins, CO (US); Stephen Hird, Fort Collins, CO (US); John Siefers, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 448 days.

(21) Appl. No.: 10/453,386

(22) Filed: Jun. 3, 2003

(65) Prior Publication Data

US 2004/0250190 A1    Dec. 9, 2004

(51) Int. Cl.
*G01R 31/28*    (2006.01)

(52) U.S. Cl. .................. 714/742; 714/25; 714/724; 702/117

(58) Field of Classification Search ............... None
See application file for complete search history.

(56) References Cited

U.S. PATENT DOCUMENTS

| | | | |
|---|---|---|---|
| 3,423,677 A * | 1/1969 | Hamilton et al. ............ 324/73.1 |
| 3,512,083 A * | 5/1970 | McCutcheon et al. ...... 324/602 |
| 4,044,244 A * | 8/1977 | Foreman et al. ............ 714/724 |
| 4,594,544 A * | 6/1986 | Necoechea .................. 714/735 |
| 4,746,855 A * | 5/1988 | Wrinn ......................... 324/763 |
| 5,025,205 A * | 6/1991 | Mydill et al. ............... 324/73.1 |
| 5,736,850 A * | 4/1998 | Legal ......................... 324/158.1 |
| 5,909,450 A * | 6/1999 | Wright ........................ 714/724 |
| 5,970,005 A | 10/1999 | Yin |
| 6,041,427 A | 3/2000 | Levy |
| 6,076,179 A * | 6/2000 | Hendricks et al. .......... 714/742 |
| 6,366,112 B1 * | 4/2002 | Doherty et al. ............. 324/765 |
| 6,377,065 B1 * | 4/2002 | Le et al. ..................... 324/765 |
| 6,433,574 B1 * | 8/2002 | Doherty et al. ............. 324/765 |
| 6,873,167 B1 * | 3/2005 | Goto et al. .................. 324/754 |

* cited by examiner

*Primary Examiner*—Albert Decady
*Assistant Examiner*—John P. Trimmings

(57) ABSTRACT

An X-Tree test apparatus for testing combinatorial logic circuits in a multiplexed digital system. The apparatus includes a plurality of contacts for electrical connection with pins on a device under test. A first driver drives a logic one signal, and a second driver drives a logic zero signal, both of which are used for testing the device. Multiplexing circuitry selectively connects the first driver and the second driver with each of the plurality of contacts and device pins. A receiver, connected with the device under test, measures a response from the logic circuit under test to the logic one and zero signals to determine if it functions as intended.

12 Claims, 3 Drawing Sheets

X-TREE TEST METHOD AND APPARATUS IN A MULTIPLEXED DIGITAL SYSTEM

FIELD OF THE INVENTION

The present invention relates to an apparatus and method for X-Tree testing in integrated circuit (IC) chip devices, particularly those having a high pin density.

BACKGROUND OF THE INVENTION

IC chip devices having combinatorial logic require testing to ensure that their connections work properly. In other words, the testing can determine whether a chip device has any broken connections, meaning that it will not function as intended. The testing utilizes a one-to-one digital channel to node count ratio. Each channel can apply a digital signal to one particular connection, and the response can be detected to determine if the corresponding chip device functions as intended. Because of the one-to-one ratio dependency, however, the digital resources required in a multiplexed test system can be exceeded even though enough node resources are available. As chip devices continue to be made with higher pin densities, testing of them becomes increasingly difficult with these one-to-one test methods.

SUMMARY OF THE INVENTION

An apparatus consistent with the present invention can be used for testing a device under test in a multiplexed digital system. The apparatus includes a plurality of contacts for electrical connection with a device under test. A first driver drives a first logic signal, and a second driver drives a second logic signal having a different value from the first logic signal. Circuitry selectively connects the first driver and the second driver with each of the plurality of contacts. A receiver, connected with the contacts, measures a response from the device under test to the first logic signal and the second logic signal applied, respectively, from the first driver and the second driver via the circuitry.

A method consistent with the present invention uses a circuit having digital drivers providing digital signals to a device under test and a receiver for receiving responsive signals from the device under test. In the method, the digital drivers are set up for providing the digital signals according to a particular pattern for testing the device under test. The receiver is set up for receiving signals from the device under test in response to the pattern of digital signals provided to the device under test by the digital drivers. Each signal in the pattern of digital signals is sequentially provided to the device under test via the digital drivers and multiplexed connections, and a response to the pattern of digital signals is measured via the receiver.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Overview

Figure 1:
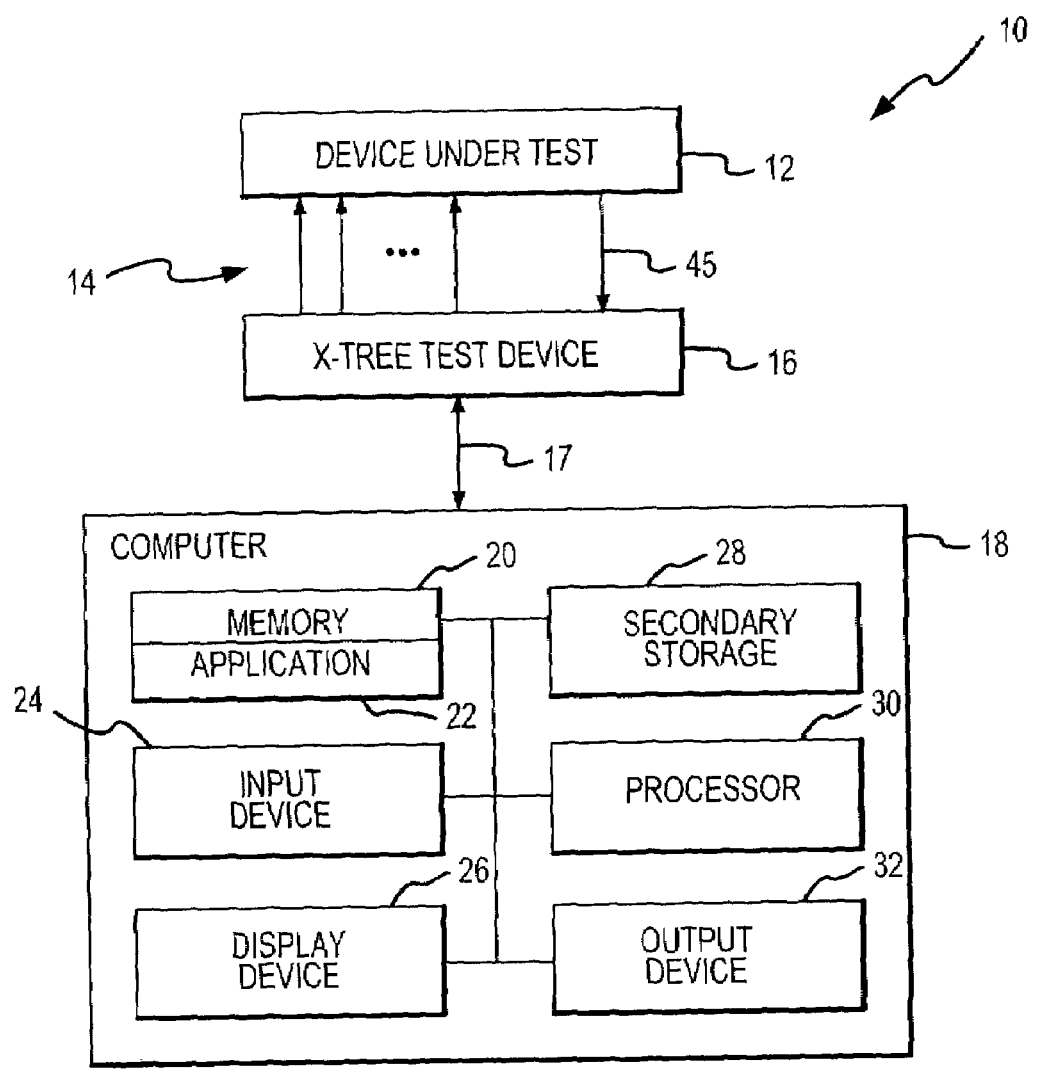
FIG. 1 is a diagram illustrating testing of a device under test in a multiplexed digital system.

FIG. 1 is a diagram illustrating testing of a device under test in a multiplexed digital system 10. In system 10, an X-Tree test device 16 is electrically connected via connections 14 with a device under test 12, typically including any combinatorial logic circuitry. X-Tree test device 16 can provide signals to device under test 12 via connections 14 for X-Tree testing of it, and X-Tree test device 16 can receive responsive signals from device under test 12 on a line 45. The term "connection" includes any type of electrical connection, and the term "line" includes any type of pathway for transmitting an electrical signal. X-Tree testing is a general term that refers to the well-known NAND-Tree, NOR-Tree, and XOR-Tree test techniques.

A computer 18 is connected with X-Tree test device 16 via a connection 17, and computer 18 controls X-Tree test device 16 to perform a test on device under test 12. The test can determine, for example, whether device under test 12 has any faulty connections and possibly whether it operates as intended. In particular, one type of test can check only for faulty connections within device under test 12, and another type of test can check for whether logic within device under test 12 operates correctly by producing intended output signals based upon a particular pattern of input signals. X-Tree test device 16 can, under control of computer 18, perform either one or both of these tests on device under test 12, or perform other tests as determined by programming of computer 18.

In use, X-Tree test device 18 includes multiplexed circuitry to provide digital one and zero signals to device under test 12 via connections 14 and receive a responsive signal from the device under test 12 on line 45. An example of a circuit for implementing device under test 18 is explained below.

Computer 18 includes exemplary components of a computer for programmatically controlling X-Tree test device 16 and providing results of the testing. Computer 18 can include, for example, a memory 20 storing one or more applications 22; a secondary storage device 28 providing for non-volatile storage of data; an input device 24 for receiving data or commands; a display device 26 for providing a visual display of information; an output device 32 for outputting information in various forms such as in hard copy or audio form; and a processor 30 for executing applications stored in memory 20, secondary storage 28, or received from a network. As explained below, computer 18 can be programmed to control X-Tree test device 16 for testing of device under test 12.

X-Tree Test Device

Figure 2:
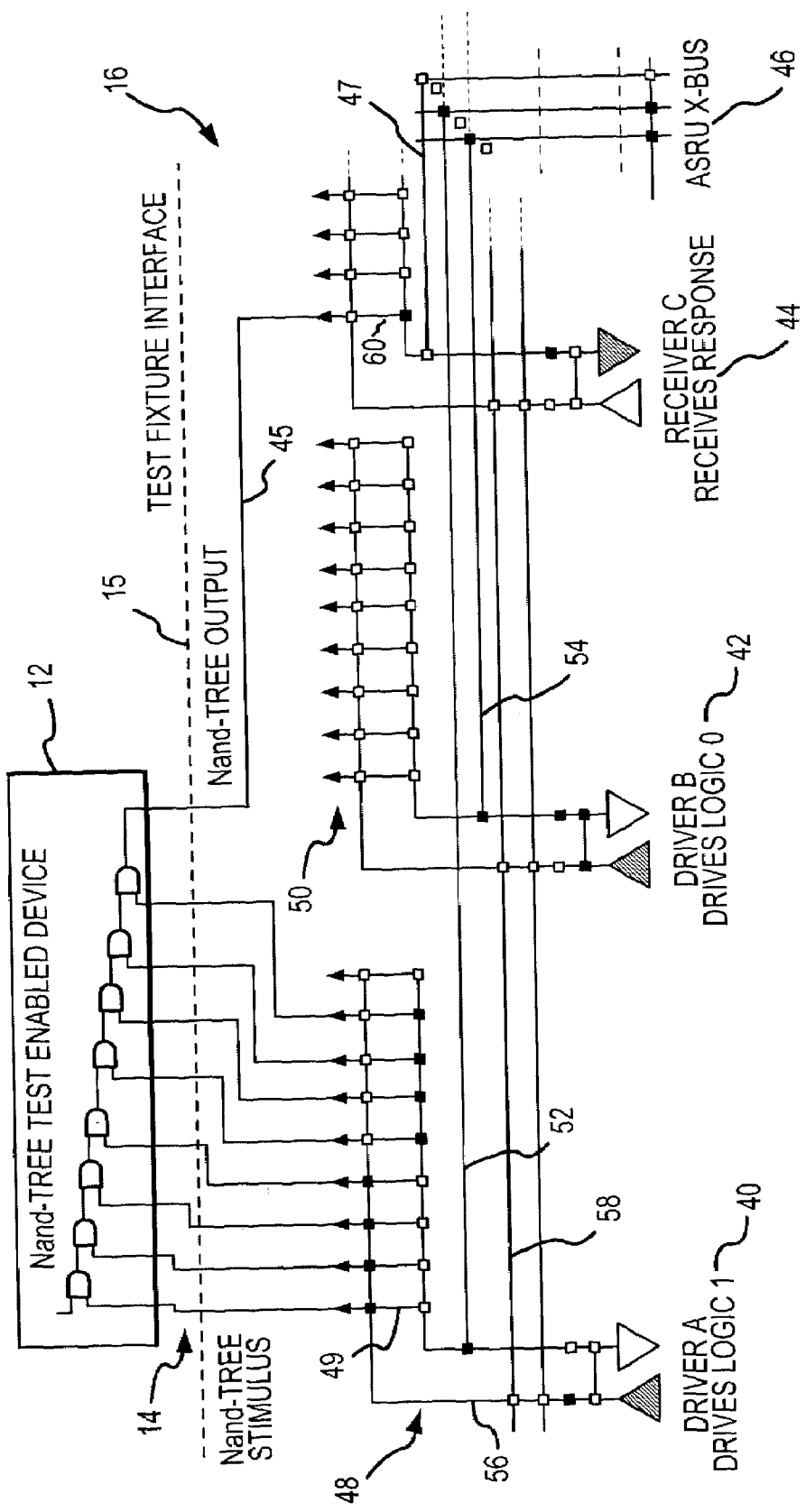
FIG. 2 is a diagram of a circuit for testing of a device under test in a multiplexed digital system.

FIG. 2 is a diagram of an exemplary circuit for implementing X-Tree test device 16 for testing of device under test 12 in multiplexed digital system 10. This example shows use of a NAND tree to test device under test 12. Alternatively, any type of digital testing can be performed on device under test 12 to perform the tests identified above. A device under test includes any type of device having combinatorial logic circuits.

Circuit 16 is connected to pins on device under test 12 at a test fixture interface 15 via connections 14 in order to provide signals to it. In an exemplary embodiment, connections 14 can be implemented via spring-loaded metal pins so that circuit 16 can be easily used for repeated testing of devices under test 12 without having to physically disconnect them. Alternatively, connections 14 can use a hardwired electrical connection or any other type of electrical connection.

Circuit 16 includes digital drivers 40 and 42 for providing logic one and zero signals, respectively, to device under test 12 in order to test it. A receiver 44 receives signals from device under test 12, via lines 45 and 60, responsive to the logic one and zero signals applied by drivers 40 and 42. Receiver 44 can be connected to computer 18 via a backplane connection 46, and computer 18 can measure the response received at receiver 44 to evaluate the operation of device under test 12. The use of backplane connections on electrical circuits is known in the art. Drivers 40 and 42 can be implemented with any type of circuit providing logic one and zero signals, or equivalent digital signals.

Driver 40 provides a logic one signal on line 56 to device under test 12 via multiplexed connections 48. In this embodiment, each connection within multiplexed connections 48, such as connection 49, is implemented with a relay that can open and close to selectively provide the logic one signal on lines 14. The relays in multiplexed connections 48 are controlled by computer 18 by providing signals on line 52 via backplane connection 46.

Likewise, driver 42 provides a logic zero signal to device under test 12. It can selectively provide the logic zero signal via multiplexed connections 50 that can be connected to lines 14 and individually controlled, using relays, by computer 18 via line 54 and backplane connection 46. Alternatively, the logic zero signals can be provided to device under test 12 via a line 58 and multiplexed connections 48. The multiplexed connections 48 and 50 can be implemented with relays, as indicated, or with any other type of circuit providing for selective transmission of digital signals.

In response to the logic one and zero signals applied by drivers 40 and 42, device under test 12 provides a responsive signal on output line 45. Receiver 44 receives the output from line 45 via line 60 and can transmit the responsive signal to computer 18 via line 47 and backplane connection 46. The responsive signal from device under test 12 will depend upon its particular combinatorial logic.

The multiplexing provided by multiplexed connections 48 and possibly 50 means that only two drivers need be used for the test, one driver for providing the logic one signal and another for providing the logic zero signal. The multiplexing of these signals provides for selectively transmitting them to the various pins on the device under test. The number of multiplexed connections 48 can be varied depending upon the number of pins on the device under test. For example, additional relays can be added in parallel with multiplexed connections 48 for devices under test having higher pin counts, such as high pin density devices.

Methodology for Multiplexed X-Tree Testing

Figure 3:
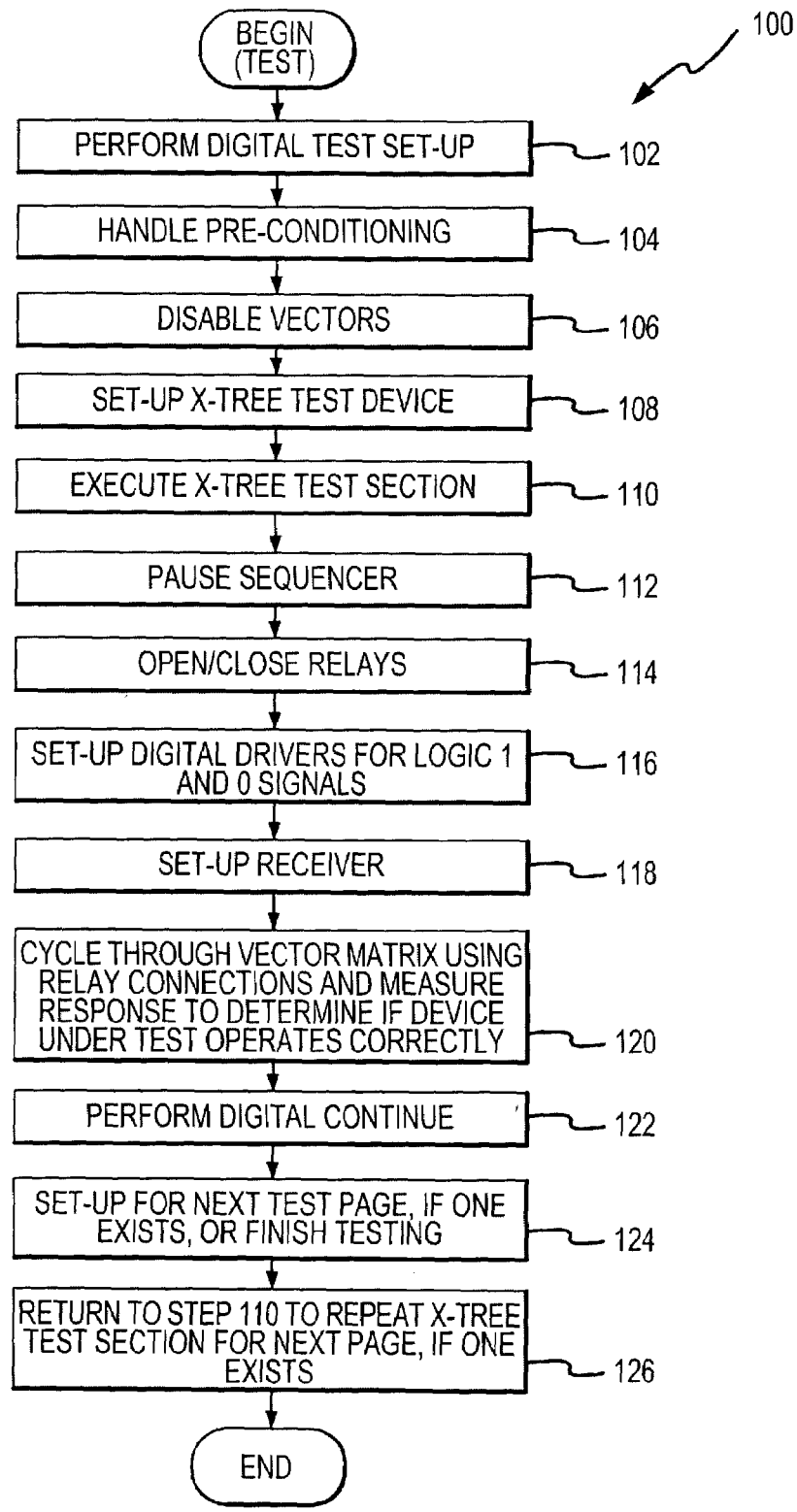
FIG. 3 is a flow chart of a method for testing of a device under test in a multiplexed digital system.

FIG. 3 is a flow chart of a method 100 for testing of device under test 12 in multiplexed digital system 10. Method 100 can be implemented in, for example, software modules for execution by processor 30 in computer 18 to control X-Tree test device 16 via backplane connection 46, as represented by connection 17. In method 100, a digital test set-up is first performed (step 102), which includes handling pre-conditioning test vectors (step 104), disabling test vectors (step 106), and setting-up X-Tree test device 16 (step 108). The digital test set-up is used to start the sequencer, which cycles through test vectors under software control. The test vector includes a pattern of input digital signals to be applied to the device under test and the corresponding responsive signals that should be received from the device under test if it is operating as intended. The test vector components will depend upon the combinatorial logic within each device under test, and the test vector is usually supplied by the manufacturer for each device under test. Set-up vectors would be handled by other digital channels, such as those shown in device 16, but not directly utilized in X-Tree test device 16 to precondition the device under test 12 into an X-Tree test mode state.

Table 1 illustrates an example of a structure for a test vector using a NAND tree for one particular device under test. This table is only an example and the actual test vector will depend upon the configuration of a corresponding device under test.

TABLE 1

| Pin # | Pin Name | NAND tree out | NAND tree in |
|---|---|---|---|
| 2 | A4 | NANDo(1) | NAND_test |
| 3 | A5 | NANDo(2) | NANDo(1) |
| 4 | A6 | NANDo(3) | NANDo(2) |
| 5 | A7 | NANDo(4) | NANDo(3) |
| 6 | A8 | NANDo(5) | NANDo(4) |
| 7 | A9 | NANDo(6) | NANDo(5) |
| 8 | A10 | NANDo(7) | NANDo(6) |
| 9 | A11 | NANDo(8) | NANDo(7) |
| 10 | A12 | NANDo(9) | NANDo(8) |
| 11 | A13 | NANDo(10) | NANDo(9) |
| 12 | A14 | NANDo(11) | NANDo(10) |
| 13 | A15 | NANDo(12) | NANDo(11) |
| 14 | A16 | NANDo(13) | NANDo(12) |
| 17 | A17 | NANDo(14) | NANDo(13) |
| 18 | A18 | NANDo(15) | NANDo(14) |
| 19 | A19 | NANDo(16) | NANDo(15) |
| 20 | A20 | NANDo(17) | NANDo(16) |
| 21 | A21 | NANDo(18) | NANDo(17) |
| 22 | A22 | NANDo(19) | NANDo(18) |
| 23 | A23 | NANDo(20) | NANDo(19) |
| 24 | A24 | NANDo(21) | NANDo(20) |
| 25 | A25 | NANDo(22) | NANDo(21) |
| 26 | A26 | NANDo(23) | NANDo(22) |
| 27 | A27 | NANDo(24) | NANDo(23) |
| 28 | A28 | NANDo(25) | NANDo(24) |
| 29 | A29 | NANDo(26) | NANDo(25) |
| 30 | A30 | NANDo(27) | NANDo(26) |
| 31 | A31 | NANDo(28) | NANDo(27) |
| 32 | AD0 | NANDo(29) | NANDo(28) |
| 33 | AD1 | NANDo(30) | NANDo(29) |
| 34 | AD2 | NANDo(31) | NANDo(30) |
| 35 | AD3 | NANDo(32) | NANDo(31) |
| 36 | AD4 | NANDo(33) | NANDo(32) |
| 37 | AD5 | NANDo(34) | NANDo(33) |
| 38 | AD6 | NANDo(35) | NANDo(34) |
| 39 | AD7 | NANDo(36) | NANDo(35) |
| 42 | CLK | NANDo(37) | NANDo(36) |
| 43 | BE0# | NANDo(38) | NANDo(37) |
| 44 | BE1# | NANDo(39) | NANDo(38) |
| 45 | BE2# | NANDo(40) | NANDo(39) |
| 46 | BE3# | NANDo(41) | NANDo(40) |
| 47 | ADS# | NANDo(42) | NANDo(41) |
| 48 | WNR | NANDo(43) | NANDo(42) |
| 49 | TT0 | NANDo(44) | NANDo(43) |
| 50 | TT1 | NANDo(45) | NANDo(44) |
| 56 | DQM7 | NANDo(46) | NANDo(45) |
| 65 | DQM6 | NANDo(47) | NANDo(46) |
| 73 | DQM5 | NANDo(48) | NANDo(47) |
| 82 | DQM4 | NANDo(49) | NANDo(48) |
| 87 | AACK#/DEN# | NANDo(50) | NANDo(49) |
| 88 | SDA | NANDo(51) | NANDo(50) |
| 92 | IOC0 | NANDo(52) | NANDo(51) |
| 93 | IOC1 | NANDo(53) | NANDo(52) |
| 94 | IOC2 | NANDo(54) | NANDo(53) |
| 95 | IOC3 | NANDo(55) | NANDo(54) |
| 96 | READY# | NANDo(56) | NANDo(55) |
| 97 | BLAST# | NANDo(57) | NANDo(56) |
| 98 | A2 | NANDo(58) | NANDo(57) |

TABLE 1-continued

| Pin # | Pin Name | NAND tree out | NAND tree in |
|---|---|---|---|
| 99 | A3 | NANDo(59) | NANDo(58) |
| 100 | ARTRY# | NANDo(60) | NANDo(59) |
| 89 | SCL | NAND_out | NANDo(60) |

Following set-up, the X-Tree test section is executed (step 110). This execution includes pausing a sequencer (step 112), opening and closing the relays in multiplexed connections 48 (step 114), setting-up digital drivers 40 and 42 for driving logic one and zero signals (step 116), setting-up receiver 44 (step 118), and cycling through the vector matrix for the test using the relay connections and measuring a response by device under test 12 (step 120).

The sequencer in step 112 includes the programming required to sequence through each part of the test vector. The relays in multiplexed connections 48 are opened and closed according to the test vector to apply the logic one and zero signals to the corresponding pins on the device under test, and computer 18 can be programmed to control the relays via backplane connection 46 according to the test vector. As the sequencer cycles through the test vector using circuit 16, the responses received at receiver 44 are transmitted to computer 18 via line 47 and backplane connection 46. As part of step 120, computer 18 can programmatically compare the responses with the expected responses in the test vector and, if there is a mismatch, it can determine that the device under test 12 has a faulty connection or otherwise does not operate as intended.

Following test execution, a digital continue operation is performed (step 122). This operation includes setting-up X-Tree test device 16 for the next test page, if one exists (step 124) and returning to step 110 to repeat execution of the X-Tree test section, if one exists (step 126). Depending upon a particular device under test, its corresponding test vector may have multiple pages of individual vectors to be applied to the device under test in order to fully test it.

While the present invention has been described in connection with an exemplary embodiment, it will be understood that many modifications will be readily apparent to those skilled in the art, and this application is intended to cover any adaptations or variations thereof. For example, various types of circuit configurations and devices under test may be used without departing from the scope of the invention. This invention should be limited only by the claims and equivalents thereof.

The invention claimed is:

1. An apparatus for testing a device under test, comprising:
 a plurality of contacts for electrical connection with a device under test;
 a first driver for driving a first logic signal;
 a second driver for driving a second logic signal, having a different value from the first logic signal;
 circuitry for selectively connecting the first driver and the second driver with each of the plurality of contacts; and
 a receiver, connected with the device under test, for measuring a response from the device under test to the first logic signal and the second logic signal applied, respectively, from the first driver and the second driver via the circuitry.

2. The apparatus of claim 1 wherein the plurality of contacts are configured for electrical connection to a combinatorial logic circuit under test.

3. The apparatus of claim 1 wherein the circuitry is controllable to apply a particular pattern of logic signals to the device under test.

4. The apparatus of claim 1 wherein the plurality of contacts are configured for releasably contacting the device under test.

5. The apparatus of claim 1 wherein the response provides an indication relating to whether the device under test operates as designed.

6. The apparatus of claim 5, further including a module for comparing the response with a known response for the device under test.

7. A method for testing a device under test, comprising:
 providing a plurality of contacts for electrical connection with a device under test;
 driving a first logic signal to the device under test via the contacts;
 driving a second logic signal to the device under test via the contacts, the second logic signal having a different value from the first logic signal;
 selectively providing the first logic signal and the second logic signal to the device under test via the plurality of contacts; and
 measuring a response from the device under test to the first logic signal and the second logic signal.

8. The method of claim 7 wherein the selectively providing step includes providing the first and second logic signals, via the contacts, to a combinatorial logic circuit under test.

9. The method of claim 7, further including applying a particular pattern of logic signals to the device under test.

10. The method of claim 7 wherein the providing step includes releasably connecting the contacts to the device under test.

11. The method of claim 7 wherein the measuring step includes outputting an indication relating to whether the device under test operates as designed.

12. The method of claim 11, further including comparing the response with a known response for the device under test.

* * * * *